(12) United States Patent
Eskridge et al.

(10) Patent No.: US 7,833,829 B2
(45) Date of Patent: Nov. 16, 2010

(54) MEMS DEVICES AND METHODS OF ASSEMBLING MICRO ELECTROMECHANICAL SYSTEMS (MEMS)

(75) Inventors: Mark Eskridge, Renton, WA (US); Galen Magendanz, Issaquah, WA (US)

(73) Assignee: Honeywell International Inc., Morristown, NJ (US)

(*) Notice: Subject to any disclaimer, the term of this patent is extended or adjusted under 35 U.S.C. 154(b) by 249 days.

(21) Appl. No.: 12/259,953

(22) Filed: Oct. 28, 2008

(65) Prior Publication Data

US 2010/0105167 A1 Apr. 29, 2010

(51) Int. Cl.
- H01L 21/50 (2006.01)
- H01L 21/48 (2006.01)
- H01L 21/44 (2006.01)
- H01L 21/78 (2006.01)
- H01L 21/46 (2006.01)
- H01L 23/02 (2006.01)
- H01L 23/06 (2006.01)
- H01L 23/544 (2006.01)

(52) U.S. Cl. .............. 438/107; 438/110; 438/113; 438/462; 438/975; 257/678; 257/684; 257/797; 257/E23.179

(58) Field of Classification Search ............ 438/107, 438/110, 113, 462, 975; 257/678, 684, 797, 257/E23.179
See application file for complete search history.

(56) References Cited

U.S. PATENT DOCUMENTS

| | | | |
|---|---|---|---|
| 6,072,326 A | 6/2000 | Akram et al. | |
| 6,208,157 B1 | 3/2001 | Akram et al. | |
| 6,396,291 B1 | 5/2002 | Akram et al. | |
| 6,630,725 B1* | 10/2003 | Kuo et al. | 257/659 |
| 6,822,324 B2* | 11/2004 | Tao et al. | 257/710 |
| 6,936,918 B2* | 8/2005 | Harney et al. | 257/704 |
| 6,946,322 B2* | 9/2005 | Brewer | 438/109 |
| 6,947,453 B2 | 9/2005 | Sidorin | |
| 6,972,480 B2* | 12/2005 | Zilber et al. | 257/678 |
| 6,995,462 B2* | 2/2006 | Bolken et al. | 257/680 |
| 7,129,576 B2 | 10/2006 | Humpston | |
| 7,224,056 B2 | 5/2007 | Burtzlaff et al. | |
| 7,298,030 B2 | 11/2007 | McWilliams et al. | |
| 7,368,808 B2* | 5/2008 | Heck et al. | 257/678 |
| 2003/0133478 A1 | 7/2003 | Sidorin | |
| 2005/0067688 A1 | 3/2005 | Humpston | |
| 2005/0082653 A1 | 4/2005 | McWilliams et al. | |

(Continued)

*Primary Examiner*—Luan C Thai
(74) *Attorney, Agent, or Firm*—Black Lowe & Graham PLLC

(57) ABSTRACT

A Micro ElectroMechanical Systems device according to an embodiment of the present invention is formed by dicing a MEMS wafer and attaching individual MEMS dies to a substrate. The MEMS die includes a MEMS component attached to a glass layer, which is attached to a patterned metallic layer, which in turn is attached to a number of bumps. Specifically, the MEMS component on the glass layer is aligned to one or more bumps using windows that are selectively created or formed in the metallic layer. One or more reference features are located on or in the glass layer and are optically detectable. The reference features may be seen from the front surface of the glass layer and used to align the MEMS components and may be seen through the windows and used to align the bumps. As an end result, the MEMS component may be precisely aligned with the bumps via optical detection of the reference features in the glass layer.

16 Claims, 2 Drawing Sheets

U.S. PATENT DOCUMENTS

| | | | |
|---|---|---|---|
| 2005/0082654 A1 | 4/2005 | Humpston et al. |
| 2005/0085016 A1 | 4/2005 | McWilliams et al. |
| 2005/0087861 A1 | 4/2005 | Burtzlaff et al. |
| 2005/0095835 A1 | 5/2005 | Humpston et al. |
| 2005/0187487 A1 | 8/2005 | Azizkhan et al. |
| 2007/0096295 A1 | 5/2007 | Burtzlaff et al. |
| 2007/0096311 A1 | 5/2007 | Humpston et al. |
| 2007/0096312 A1 | 5/2007 | Humpston et al. |
| 2008/0001241 A1 | 1/2008 | Tuckerman et al. |
| 2008/0002460 A1 | 1/2008 | Tuckerman et al. |
| 2008/0029879 A1 | 2/2008 | Tuckerman et al. |
| 2008/0032457 A1 | 2/2008 | McWilliams et al. |

* cited by examiner

MEMS DEVICES AND METHODS OF ASSEMBLING MICRO ELECTROMECHANICAL SYSTEMS (MEMS)

BACKGROUND OF THE INVENTION

Micro ElectroMechanical Systems (MEMS) are used in a variety of applications from navigational or guidance systems to ballistic applications. In the manufacture of some MEMS devices, a MEMS wafer is attached to a package or board (e.g., substrate), for example, using flip chip methodologies such as ball grid array (BGA), controlled areas of solder, gold stud bump flip chip, etc., but without actually flipping the chip. Further, the MEMS wafers are mounted face up instead of face down on the substrate, but still require the mechanical advantages of flip chip mounting. The MEMS wafer typically includes a glass layer coupled to a continuous metallic layer with a number of MEMS components attached to the free or front surface of the glass layer. Once the MEMS wafer is produced, it is diced or segmented to make individual dies. Each die may then be attached to the substrate by applying a bump pattern to the substrate and then bonding the die to the bump pattern. The metallic layer is generally used solely as a layer to adhere the MEMS die to a next level of packaging (i.e., the substrate). The alignment of the die relative to the substrate affects the performance and accuracy of the MEMS device.

One conventional method for making the MEMS wafer, dicing the wafer, and attaching the dies to a substrate includes (1) dicing the wafer using alignment marks placed on the metallic layer of the wafer; (2) applying a bump patter to the substrate; (3) aligning a die on a portion of the substrate using the edges of the die; and (4) bonding the die to the substrate. In each of these steps, an amount of error may be introduced and these errors may accumulate. For example, the position of each MEMS component in relation to the edges of each respective die may vary slightly because of errors introduced during the dicing operation, errors introduced when applying the bump pattern to the substrate, errors introduced when aligning the die to the portion of the substrate and errors introduced when bonding the die to the substrate.

One approach to correcting one or more of the above-identified alignment errors is to place the bump pattern on the backside of the die to reduce any misalignment of the die to the bump pattern. This approach works only if there is no metallic layer forming the backside of the die. However, when the backside of the die is a metallic layer or a non-transparent layer there is no way to sufficiently align the MEMS component to the bump pattern and thus alignment errors still persist.

SUMMARY OF THE INVENTION

The present invention general relates to a MEMS device having a MEMS die mounted on a substrate, otherwise referred to as a board or package. The MEMS die is produced from a MEMS wafer that includes a MEMS component mounted to a glass layer, which in turn is mounted to a metallic layer. The MEMS dies are produced by dicing or otherwise segmenting the MEMS wafer. In one embodiment, the MEMS wafer includes at least two windows formed in the metallic layer so the bumps of a bump pattern placed on the metallic layer may be optically aligned with corresponding MEMS components located on the glass layer. In addition, the bumps and MEMS components may be aligned using the windows to optically register the bumps and MEMS components with respect to at least one reference feature of the glass layer. The reference feature may take the form of a fiducial or metallic trace embedded in the glass layer.

In one aspect of the invention, a MEMS wafer includes a glass layer having a first surface and a second surface, the glass layer having at least one reference feature; a metallic layer having a first surface and a second surface, the first surface coupled to the first surface of the glass layer, the metallic layer having at least two windows extending through the metallic layer and operable to transmit light there through, the at least two windows arranged to permit optical detection of the at least one reference feature of the glass layer; a plurality of MEMS components coupled to the second surface of the glass layer, and a bump pattern arranged on the second surface of the metallic layer, the bump pattern optically aligned with the plurality of MEMS components using the at least two windows located in the metallic layer to optically locate the at least one reference feature of the glass layer.

In another aspect of the invention, a MEMS device includes a substrate having a perimeter; and a diced portion of a MEMS wafer registered with respect to at least one feature applied to the MEMS wafer, the diced portion of the MEMS wafer including a glass layer, a metallic layer, a MEMS component, and a bump pattern, wherein the glass layer includes a first surface, a second surface and at least one reference feature, the MEMS component coupled to the second surface of the glass layer, the metallic layer having a first surface and a second surface, the first surface coupled to the first surface of the glass layer, and the bump pattern arranged on the second surface of the metallic layer, the bump pattern optically aligned with the MEMS component and with the at least one reference feature of the glass layer.

In yet another aspect of the invention, a method for assembling a MEMS device includes the steps of (1) forming a glass layer having at least one reference feature; (2) forming a metallic layer having at least two light transparent windows extending through the metallic layer; (3) attaching the metallic layer to the glass layer; (4) attaching a plurality of MEMS components on an opposite side of the glass layer from the metallic layer; (5) attaching a bump pattern on an opposite side of the metallic layer from the glass layer, the bump pattern having a plurality of bumps optically aligned with respect to the MEMS components through the at least two windows; (6) forming individual MEMS dies; and (7) aligning and mounting the MEMS dies onto a substrate.

BRIEF DESCRIPTION OF THE DRAWINGS

Preferred and alternative embodiments of the present invention are described in detail below with reference to the following drawings:

FIG. 1-2 is side elevational view of the MEMS wafer of FIG. 1A being diced into respective MEMS dies according to an embodiment of the invention;

FIG. 1-3 is side elevational, diagrammatic view of a method of making a MEMS device by selecting, flipping, and placing a MEMS die on a substrate according to an illustrated embodiment of the invention; and FIG. 1-4 is a top plan view of the MEMS device that was made in FIG. 3; and FIG. 2 is an exploded side elevational view of a single MEMS die taken from the diced MEMS wafer of FIG. 1-2.

DETAILED DESCRIPTION OF ONE EMBODIMENT

Figure 1:
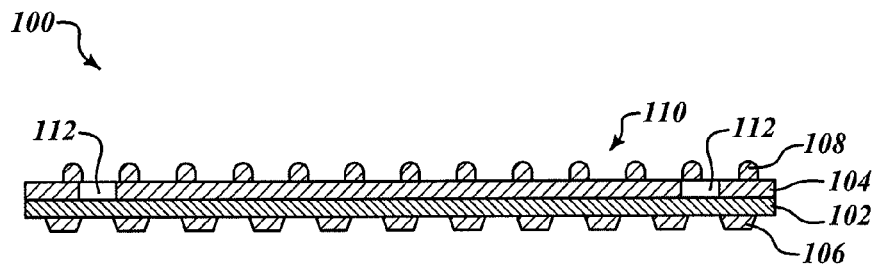
FIG. 1-1 is a side elevational view of a MEMS wafer having a metallic layer with at least two windows formed therein to align a bump pattern with one or more MEMS components according to an illustrated embodiment of the invention.
Figures 1, 2:
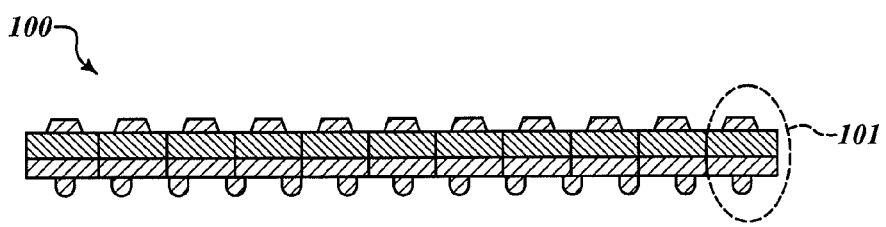
Figures 1, 2, 3:
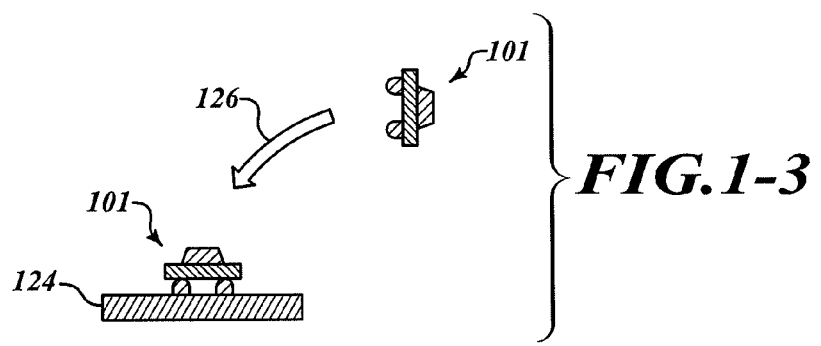
Figures 1, 2, 3, 4:
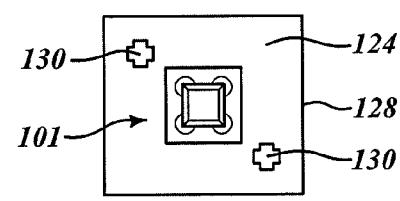
Figure 2:
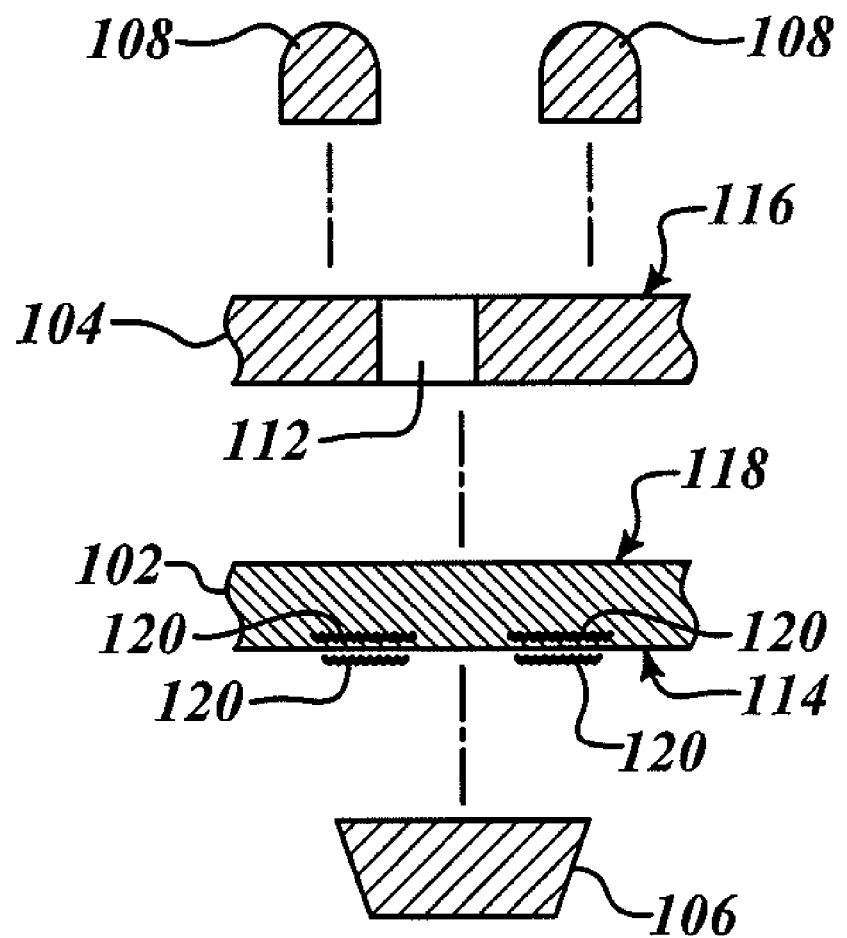

FIGS. 1-1 and 1-2 show a MEMS wafer 100 having a glass layer 102 coupled to a metallic layer 104. One or more MEMS components 106 are arranged on the glass layer 102 while a number of bumps 108 forming a bump pattern 110 are arranged on the metallic layer. The metallic layer 104 includes at least two windows 112 extending through the thickness of the metallic layer 104. The windows 112 may be openings or may be filled with a light transmissive material, such as a material that is optically transparent at least at some frequency of light. The glass layer 102, likewise, may be a silicon glass layer 102 and also optically transparent at the same frequency of light. The MEMS components 106 may take the form of a sensor, such as an inertial sensor. FIG. 1B shows the MEMS wafer 100 undergoing a dicing or segmenting operation to create individual MEMS dies 101.

FIG. 2 shows a portion of the MEMS wafer 100 having the glass layer 102, the metallic layer 104, the MEMS component 106, and bumps 108. The MEMS component 106 is mounted on a front surface 114 of the glass layer 102 while the bumps 108 are mounted to a back surface 116 of the metallic layer 104. In turn, the metallic layer 104 is applied to or adjacent to a back surface 118 of the glass layer 102. Unlike the conventional MEMS wafers and conventional MEMS devices discussed above, the metallic layer 104 of the present invention includes a non-continuous (e.g., not blanketed) layer of metal on the back surface 118 of the glass layer 102. By way of example, the metallic layer 104 may take the form of a gold, silver, titanium, chromium, or platinum layer, for example. The non-continuous metallic layer 104 may be created by patterning the metallic layer 104 with windows 112 selectively arranged so that one or more reference features 120 located on the front surface 114 of the glass layer 102 or embedded in the glass layer 102 are optically detectable by looking through the windows 112. The pattern of the metallic layer 104 with the windows 112 may be formed using MEMS techniques such as photolithography or shadow masking. The reference features 120 are shown schematically in the illustrated embodiment, but may take the form of fiducials, conductive traces, or alignment marks, for example. Further, the reference features 120 may be oriented in a variety of directions and are not limited to the two-dimensional configuration schematically illustrated in FIG. 2. The reference features 120 may be utilized for wire-bonding and die placement, as discussed in more detail below.

In one embodiment, the MEMS components 106 are aligned on the front surface 114 of the glass layer 102 using the reference features 120. And because the front surface 114 is easily viewable, the alignment of the MEMS components 106 tends to be quite accurate. Viewable, as used herein, may include, but not be limited to, humanly viewable, viewable using optical, mechanical, magnetic, electrical equipment, or some combination of the same. Next, the bumps 108 are aligned with the MEMS components 106 by optically detecting the reference features 120 through the windows 112. The reference features 120 maybe considered to be registered to the wafer 100, thus locating two independent reference features 120 provides an accurate alignment of the bumps 108 with respect to a corresponding MEMS component 106. In one embodiment, the reference features 120 are located using a pattern recognition system.

The windows 112 need only be roughly aligned and large enough to allow a view of the reference features 120 located on or in the glass layer 102. Using the windows 112 in conjunction with proper lighting conditions permits the accurate alignment and placement of the bumps 108 on the back surface 116 of the metallic layer 104 with respect to the MEMS components 106. Consequently, the reference features 120 are used to align both the MEMS components 106 and the bumps 108 precisely using the windows 112. Advantageously, this alignment process reduces or eliminates cumulative alignment errors and produces a MEMS device that is more robust and better performing than conventional MEMS devices, yet may still be mass produced cost effectively with repeated accuracy.

Referring to FIGS. 1-3 and 1-4, the MEMS die 101 may be attached to a substrate 124 to form part of a circuit board, for example. Equipment, such as a robotic pick and place mechanism, may use the reference features 120 to pick up, flip, and then place the die 101 on the substrate 124 as indicated by arrow 126. FIG. 1-4 shows the die 101 aligned with a perimeter 128 of the substrate 124 or aligned with other reference features 130 located on the substrate 124.

While one embodiment of the invention has been illustrated and described, as noted above, many changes can be made without departing from the spirit and scope of the invention. Accordingly, the scope of the invention is not limited by the disclosure of one embodiment. Instead, the invention should be determined entirely by reference to the claims that follow.

The embodiments of the invention in which an exclusive property or privilege is claimed are defined as follows:

1. A Micro ElectroMechanical Systems wafer comprising:
    a glass layer having a first surface and a second surface, the glass layer having at least one reference feature;
    a metallic layer having a first surface and a second surface, the first surface coupled to the first surface of the glass layer, the metallic layer having at least two windows extending through the metallic layer and operable to transmit light therethrough, the at least two windows arranged to permit optical detection of the at least one reference feature of the glass layer;
    a plurality of MEMS components coupled to the second surface of the glass layer, and
    a bump pattern arranged on the second surface of the metallic layer, the bump pattern optically aligned with the plurality of MEMS components using the at least two windows located in the metallic layer to optically locate the at least one reference feature of the glass layer.

2. The MEMS wafer of claim 1, wherein the glass layer is a silicon layer.

3. The MEMS wafer of claim 1, wherein the metallic layer is a gold metallic layer.

4. The MEMS wafer of claim 1, wherein the at least one reference feature includes a metallic trace element applied to the glass layer.

5. The MEMS wafer of claim 1, wherein the at least one reference feature includes alignment marks carried on the second surface of the glass layer.

6. A MEMS device comprising:
    a substrate having a perimeter; and
    a diced portion of a MEMS wafer registered with respect to at least one feature applied to the MEMS wafer, the diced portion of the MEMS wafer including a glass layer, a metallic layer, a MEMS component, and a bump pattern, wherein
    the glass layer includes a first surface, a second surface and at least one reference feature,
    the MEMS component coupled to the second surface of the glass layer, the metallic layer having a first surface and a second surface, the first surface coupled to the first surface of the glass layer, and the bump pattern arranged on the second surface of the metallic layer, the bump pattern optically aligned with the MEMS component and with the at least one reference feature of the glass layer.

7. The MEMS device of claim 6, wherein the metallic layer includes a window extending through the metallic layer and operable to transmit light there through, the window positioned to permit optical detection of the at least one reference feature of the glass layer.

8. The MEMS device of claim 6, wherein the glass layer is a silicon layer.

9. The MEMS device of claim 6, wherein the metallic layer is a gold metallic layer.

10. The MEMS device of claim 6, wherein the at least one reference feature includes a metallic trace element applied to the glass layer.

11. The MEMS device of claim 6, wherein the at least one reference feature includes alignment marks carried on the second surface of the glass layer.

12. A method for assembling a MEMS device, the method comprising:
    forming a glass layer having at least one reference feature;
    forming a metallic layer having at least two light transparent windows extending through the metallic layer;
    attaching the metallic layer to the glass layer;
    attaching a plurality of MEMS components on an opposite side of the glass layer from the metallic layer;
    attaching a bump pattern on an opposite side of the metallic layer from the glass layer, the bump pattern having a plurality of bumps optically aligned with respect to the MEMS components through the at least two windows; and
    forming individual MEMS dies; and
    aligning and mounting the MEMS dies onto a substrate.

13. The method of claim 12, wherein forming the metallic layer includes patterning the metallic layer using a masking technique.

14. The method of claim 12, further comprising:
    filling at least two windows with a light transparent material.

15. The method of claim 12, wherein attaching the bump pattern includes adhering the bump pattern.

16. The method of claim 12, wherein forming individual MEMS dies includes dicing a MEMS wafer.

* * * * *